US010068965B1

(12) United States Patent
Qiao et al.

(10) Patent No.: US 10,068,965 B1
(45) Date of Patent: Sep. 4, 2018

(54) LATERAL HIGH-VOLTAGE DEVICE

(71) Applicant: University of Electronic Science and Technology of China, Chengdu (CN)

(72) Inventors: Ming Qiao, Chengdu (CN); Yang Yu, Chengdu (CN); Wentong Zhang, Chengdu (CN); Zhengkang Wang, Chengdu (CN); Zhenya Zhan, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 15/718,001

(22) Filed: Sep. 28, 2017

(30) Foreign Application Priority Data

Jun. 26, 2017 (CN) .......................... 2017 1 0495848
Jun. 26, 2017 (CN) .......................... 2017 1 0496712

(51) Int. Cl.
| | |
|---|---|
| *H01L 29/06* | (2006.01) |
| *H01L 29/78* | (2006.01) |
| *H01L 27/02* | (2006.01) |
| *H01L 29/40* | (2006.01) |
| *H01L 29/739* | (2006.01) |
| *H01L 29/735* | (2006.01) |

(52) U.S. Cl.
CPC ........ *H01L 29/063* (2013.01); *H01L 27/0266* (2013.01); *H01L 29/402* (2013.01); *H01L 29/408* (2013.01); *H01L 29/735* (2013.01); *H01L 29/739* (2013.01); *H01L 29/7816* (2013.01)

(58) Field of Classification Search
CPC ... H01L 29/063; H01L 29/402; H01L 29/408; H01L 29/735; H01L 29/739; H01L 29/7816; H01L 27/0266
See application file for complete search history.

(56) References Cited

U.S. PATENT DOCUMENTS

| | | | |
|---|---|---|---|
| 2006/0038224 A1* | 2/2006 | Shibib ................. | H01L 29/407 257/335 |
| 2007/0102773 A1* | 5/2007 | Hisatomi ............. | H01L 29/063 257/401 |
| 2008/0135930 A1* | 6/2008 | Saito .................... | H01L 29/0634 257/330 |
| 2009/0032865 A1* | 2/2009 | Hirler ................. | H01L 29/66712 257/328 |

(Continued)

*Primary Examiner* — Nathan W Ha
(74) *Attorney, Agent, or Firm* — Gokalp Bayramoglu

(57) ABSTRACT

The present invention relates to a lateral high-voltage device. The device includes a dielectric trench region. A doping-overlapping structure with different doping types alternating mode is provided at least below, on a left side of, or on a right side of the dielectric trench region. The device also includes a dielectric layer, a body field plate, a polysilicon gate, a gate oxide layer, a first N-type heavy doping region, a second N-type heavy doping region, a P-type heavy doping region, a P-well region, the first N-type doping pillar, the second N-type doping pillar, the third N-type doping pillar, the first P-type doping pillar, and the second P-type doping pillar. The invention adopts a dielectric trench region in the drift region to keep the breakdown voltage BV of the device while reducing the surface area of the device, and effectively reducing the device's specific On-Resistance $R_{ON,sp}$.

12 Claims, 19 Drawing Sheets

(56) References Cited

U.S. PATENT DOCUMENTS

| | | | |
|---|---|---|---|
| 2013/0334601 A1* | 12/2013 | Dong | H01L 29/66704 257/339 |
| 2015/0236085 A1* | 8/2015 | Dong | H01L 29/063 257/330 |
| 2017/0148871 A1* | 5/2017 | Kocon | H01L 29/0634 |
| 2017/0263727 A1* | 9/2017 | Mallikarjunaswamy | H01L 29/735 |

* cited by examiner

US 10,068,965 B1

LATERAL HIGH-VOLTAGE DEVICE

CROSS REFERENCE

The present application is based on, and claims priority to Chinese application numbers CN201710495848.X and CN2017104967120, both filed on Jun. 26, 2017, the disclosures of which are hereby incorporated by reference in their entirety.

TECHNICAL FIELD

The present invention relates to semiconductor power devices, particularly relates to a lateral high-voltage device.

BACKGROUND

As a core device in PIC (Power Integrated Circuit), a power LDMOSFET (Lateral Double-diffused Metal-Oxide-Semiconductor Field Effect Transistor) has the advantages of easy integration, low drive power and negative temperature coefficient, and has been developing for many years in the direction of high breakdown Voltage (BV) and lower specific On-Resistance ($R_{ON,sp}$). The higher breakdown Voltage BV requires that the device has a longer drift region length and a lower drift region doping concentration, which leads to a higher specific On-Resistance $R_{ON,sp}$. The contradiction between the breakdown Voltage BV and the specific On-Resistance Ro N, is the problem of "Silicon Limit" in the industry.

In order to alleviate this contradiction, and ensure the device has high breakdown Voltage BV and low specific On-Resistance $R_{ON,sp}$, the researcher introduces the dielectric trench in the LDMOS lateral drift region. The dielectric trench can withstand most lateral pressure and shorten the lateral dimension of the device, and greatly reduce the area of the chip. However, the traditional dielectric trench LDMOS still has a large specific On-Resistance $R_{ON,sp}$, which could not further relieve the contradiction between the breakdown Voltage BV and the specific On-Resistance $R_{ON,sp}$.

SUMMARY OF INVENTION

The present invention aims to solve one or more of the above problems, and the present invention proposes a lateral high-voltage device, aiming to keep the high breakdown Voltage BV of the device while reduce the device's specific On-Resistance $R_{ON,sp}$.

For realizing the invention, the technical schemes of the invention are as follows:

A lateral high-voltage device, comprising a dielectric trench region 2, a doping-overlapping structure with different doping types alternating mode is provided at at least one position i.e. below, on the left side, or on the right side of the dielectric trench region 2. The upper surface of the dielectric trench region 2 is a dielectric layer 22, and a body field plate 53 extends from the upper surface of the device to the interior of the dielectric trench region 2. The body field plate 53 adjacently connects a polysilicon gate 52. A gate oxide layer 21 is below polysilicon gate 52. A source contacting terminal 51 and the polysilicon gate 52 are isolated through the dielectric layer 22. The body field plate 53 and a drain contacting terminal 54 are isolated through the dielectric layer 22. A second N-type heavy doping region 35 is below the drain contacting terminal 54. An adjacent P-type heavy doping region 41 and a first n-type heavy doping region 31 are below the source contacting terminal 51. The P-type heavy doping region 41 and the first N-type heavy doping region 31 are positioned in the P well region 42 and at the top of the P well region 42. The gate oxide layer 21 is positioned above the P-well region 42. A conductive pathway consisting of a first N-type doping pillar 32, a second N-type doping pillar 33 and a third N-type doping pillar are respectively provided on two sides and below the dielectric trench region 2. A first P-type doping pillar 43 and a second P-type doping pillar 44 are provided on the two sides of the conductive pathway. A P-type substrate 1 is below the conductive pathway. If the doping-overlapping structure is below the dielectric trench region 2, then the doping-overlapping structure sequentially includes the third N-type doping pillar 34, a third P-type doping pillar 45 and a sixth N-type doping pillar 38. If the doping-overlapping structure is on the right side of the dielectric trench region 2, then the doping-overlapping structure sequentially includes the second N-type doping pillar 33, the second P-type doping pillar 44 and a seventh N-Type doping pillar 39, and the upper surfaces of the N-type doping pillar 33, the P-type doping pillar 44 and the N-type doping pillar 39 contact with the second N-type heavy doping region 35. If the doping-overlapping structure is on the left side of the dielectric trench region 2, then the doping-overlapping structure sequentially includes the first N-type doping pillar 32, the first P-type doping pillar 43 and a fifth N-type doping pillar 37, and there is a fourth N-type doping pillar 36 between the doping-overlapping structure and the P-well region 42.

Preferably, the dielectric trench region 2 is divided into a plurality of dielectric regions with different dielectric constants from top to bottom, and the dielectric constant in each dielectric area is raised in turn from top to bottom.

Preferably, a pair of adjacent N-type doping pillar and P-type doping pillar constitute one group. The doping-overlapping structures includes a plurality of groups with multiple N-type doped pillars and P-type doped pillars in an alternating mode, wherein a group number is greater than 2.

Preferably, the device is a SOI device. The substrate 1 is N-type silicon or P-type silicon for the SOI device.

Preferably, there is an epitaxial layer 46 between the P-type substrate 1 and the conductive pathway, or the epitaxial layer 46 is arranged between a SOI buried oxygen layer 23 and the conductive pathway.

Preferably, the polysilicon gate 52 and the gate oxide layer 21 constitute a trench gate, at this time, the source contacting terminals 51 and the body field plate 53 are adjacent.

Preferably, the trench gate consisting of the polysilicon gate 52 and the gate oxide layer 21 extends to the interior of the P-type substrate 1, at this time, the source contacting terminal 51 and the body field plate 53 are adjacent.

Preferably, the trench gate consisting of the polysilicon gate 52 and the gate oxide layer 21 is arranged inside the dielectric trench region 2.

Preferably, the second N-type heavy doping region 35 is replaced by a collector P-type heavy doping region 47, so the device is changed from a LDMOS device to a LIGBT device.

Preferably, the left side of the drain contacting terminal 54 contacts with an electrode field plate 58, and the electrode field plate 58 extends from the surface of the device to the interior of the dielectric trench region.

Preferably, the N-type doping pillars have different widths as the P-type doping pillars.

Preferably, the doping type of the device structure is correspondingly changed to the opposite doping type, that is, the P-type doping becomes N-type doping, and the N-type doping becomes P-type doping.

The advantages of the present embodiments: by introducing the dielectric trench region in the drift region, the device can keep the character of withstanding voltage, reduce the surface area and reduce the specific On-Resistance $R_{ON,sp}$; in the device drift region, a cascade of P-type heavy doping pillars and N-type heavy doping pillars are introduced to provide a low resistance conductive pathway for the on state of the device, which can further reduce the specific On-Resistance $R_{ON,sp}$ of the device, and finally achieve the purposes of effectively reducing the device area and reducing the specific On-Resistance $R_{ON,sp}$.

Wherein, 1 is the P-type substrate, 2 is the dielectric trench region, 21 is the gate oxide layer, 22 is the dielectric layer, 23 is the SOI oxygen layer, 31 is the first N-type heavy doping region, 32 is the first N-type doping pillar, 33 is the second N-type doping pillar, 34 is the third N-type doping pillar, 35 is the second N-type heavy doping region, 36 is the fourth N-type doping pillar, 37 is the fifth N-type doping pillar. 38 is the sixth N-type doping pillar, 39 is the seventh N-type doping pillar, 41 is the P-type heavy doping region, 42 is P-well region, 43 is the first P-type doping pillar, 44 is the second P-type doping pillar, 45 is the third P-type doping pillar, 46 is the epitaxial layer, 47 is the collector terminal P-type heavy doping region, 51 is the source contacting terminal, 52 is the polysilicon gate, 53 is the body field plate, 54 is the drain contacting terminal, 55 is the low-K dielectric trench, 56 is the dielectric trench, 57 is the second dielectric trench, 58 is the electrode field plate.

DETAILED DESCRIPTION OF THE INVENTION

The following specific examples illustrate the embodiments of the invention, and the skilled personnel in this field can easily understand the other advantages and effects of the invention by the contents disclosed in this specification. The invention can also be implemented or applied by different embodiments, the details can be modified and altered based on different viewpoints and applications, without departing from the spirit of the invention.

By adding the dielectric trench region into the drift region, the dielectric trench region is subjected to lateral pressure while reducing device size, and thus the specific On-Resistance $R_{ON,sp}$ of the device is also reduced. On the other hand, the heavy doping N-type doping pillars are introduced into the drift region, providing low resistance conductive pathway for the on-state electronic current of the device, and further reducing the specific On-Resistance $R_{ON,sp}$ of the device. The body field plate 53 is introduced into the dielectric trench region for the auxiliary depletion of the heavy doping N-type doping pillars to improve the breakdown Voltage BV of the device. The heavy doping P-type doping pillars are also introduced into the drift region, so that while the N-type doping pillars are depleted when the state is off, an additional electric field is formed to improve the breakdown Voltage BV of the device.

Figure 18:
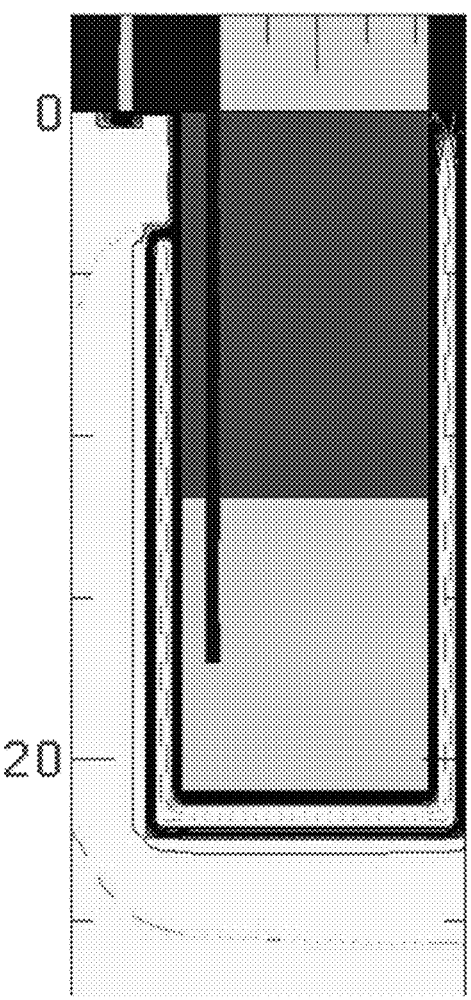
FIG. 18 is the on state current distribution diagram of the device simulation of the embodiment 13 of the invention.
Figure 19:
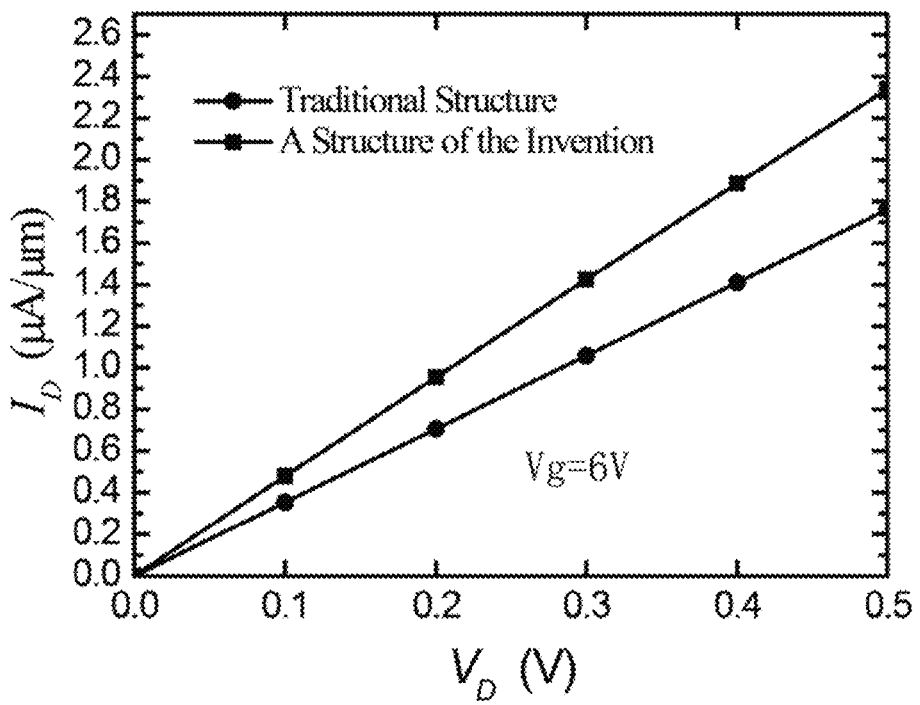
FIG. 19 is the on state linear region current diagram of the device simulation of the embodiment 13 of the invention.
Figure 20:
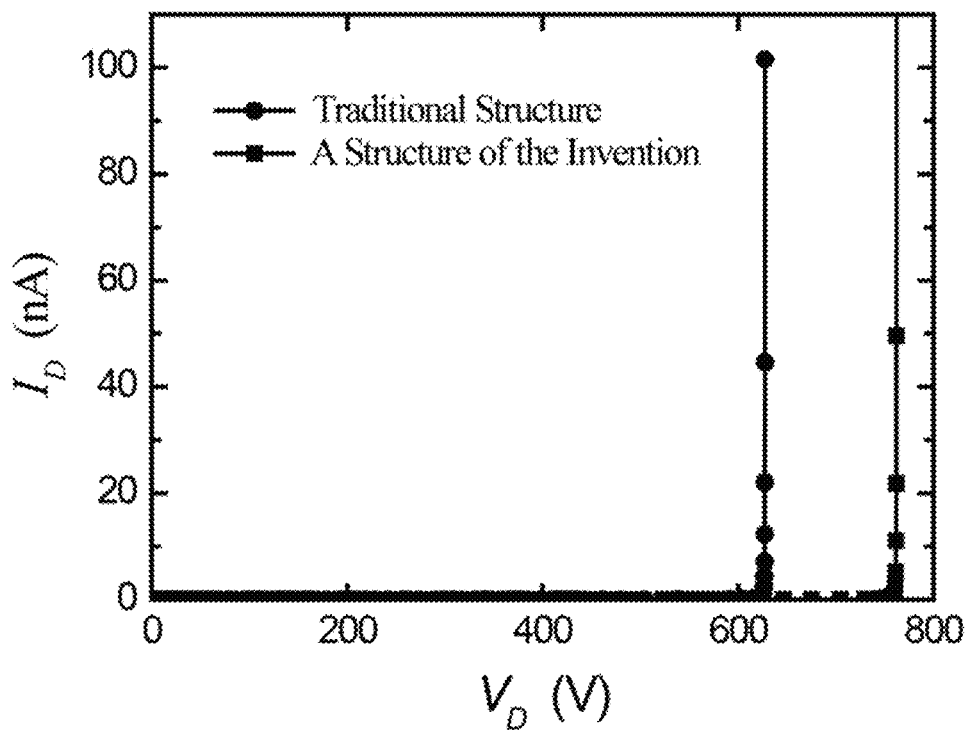
FIG. 20 is the off state BV diagram of the device simulation of the embodiment 13 of the invention.

FIG. 18 is an on state current distribution diagram of the trench type lateral high-voltage device of the invention. As the diagram shows, when the device is in on state, the current is distributed in two low resistance conductive pathways provided by the N-type heavy doping pillars, so that the current capacity is enhanced when the surface area is unchanged, i.e., the specific On-Resistance $R_{ON,sp}$ of the device is reduced when the surface area is unchanged. FIG. 19 is the current diagram of the on state linear region of the structural device of the invention. By MEDICI device simulation, a sample structure of the present invention has a 27% reduction in its linear resistance compared with the traditional structure. FIG. 20 is the off state BV diagram of the structure device simulation of the invention. As to an exemplary structure of the present invention, the breakdown Voltage BV has an increase of about 140V compared with the traditional structure. The invention can greatly reduce the specific On-Resistance $R_{ON,sp}$ while obtaining a high breakdown Voltage BV.

Embodiment 1

Figure 1:
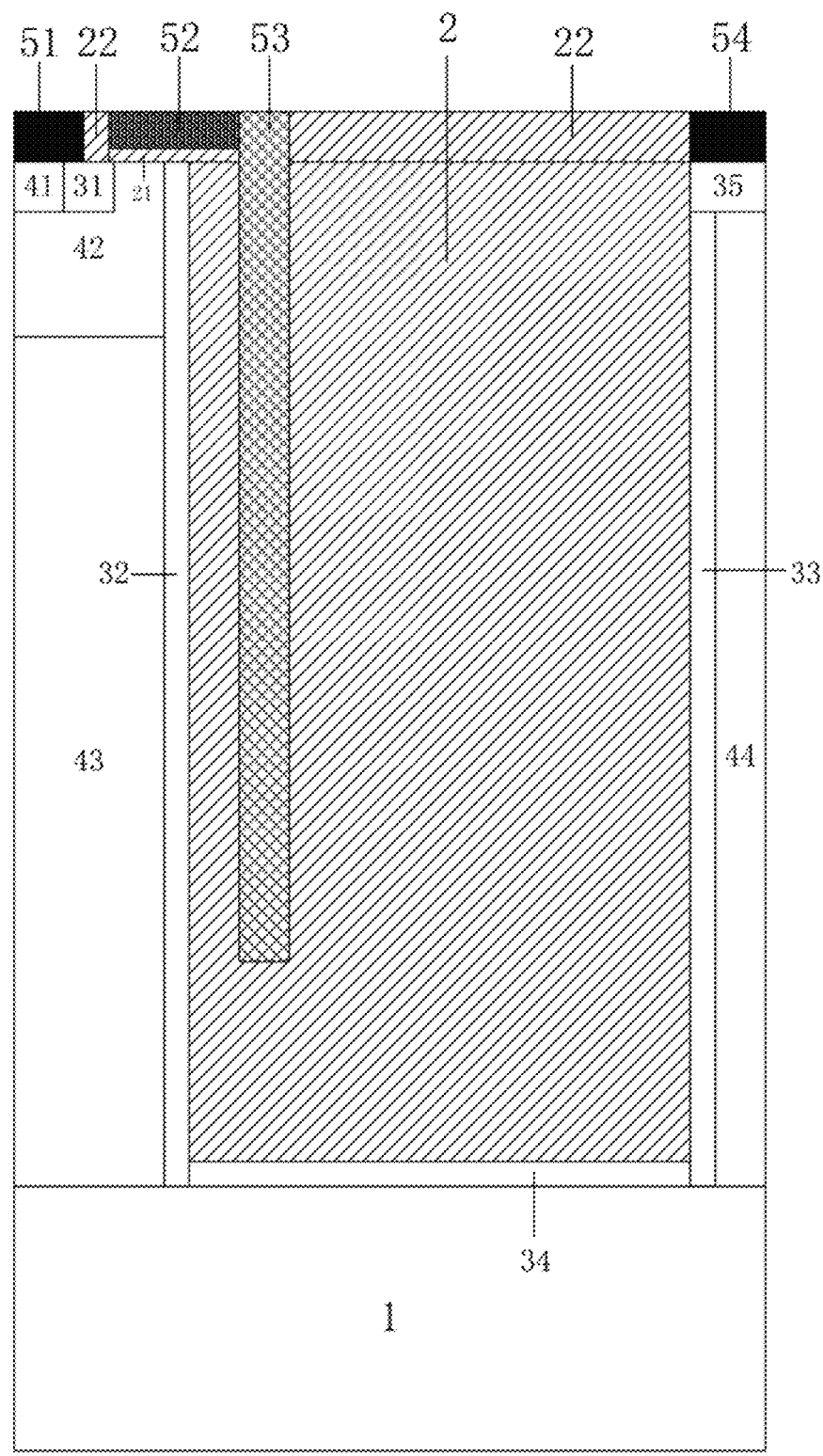
FIG. 1 is a schematic diagram of a conventional lateral dielectric trench high-voltage device.
Figure 2:
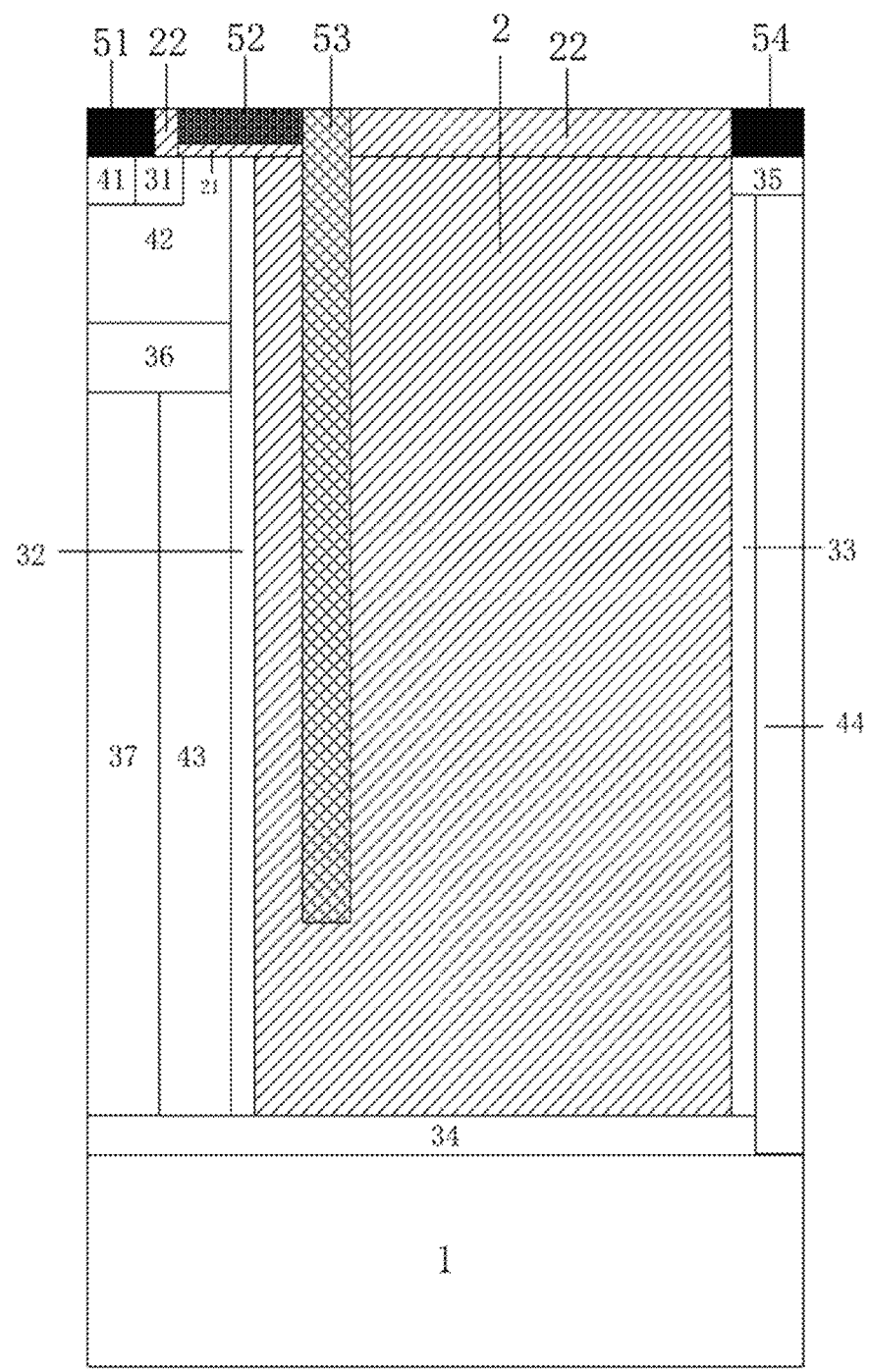
FIG. 2 is a schematic diagram of a device structure of the embodiment 1 of the invention, wherein the doping-overlapping structure is located on the left side of the dielectric trench region

As shown in FIG. 2, a lateral high-voltage device, comprising: a dielectric trench region 2, a doping-overlapping structure with different doping types in an alternating mode is provided on the left side of the dielectric trench region 2. The doping-overlapping structure includes the first N-type doping pillar 32, the first P-type doping pillar 43 and a fifth N-type doping pillar 37, and there is a fourth N-type doping pillar 36 between the doping-overlapping structure and the P-well region 42. The upper surface of the dielectric trench region 2 is a dielectric layer 22, and a body field plate 53 extends from the surface of the device to the interior of the dielectric trench region 2. The body field plate 53 is adjacently connected to a polysilicon gate 52, the gate oxide layer 21 is located below the polysilicon gate 52. A source contacting terminal 51 and the polysilicon gate 52 are isolated through the dielectric layer 22. The body field plate 53 and a drain contacting terminal 54 are isolated through the dielectric layer 22. A second N-type heavy doping region 35 is below the drain contacting terminal 54. An adjacent P-type heavy doping region 41 and a first n-type heavy doping region 31 are below the source contacting terminal 51. The P-type heavy doping region 41 and the first N-type heavy doping region 31 are positioned in the P well region 42 and at the top of the P well region 42. The gate oxide layer 21 is positioned above the P-well region 42. A conductive pathway consisting of a first N-type doping pillar 32, a second N-type doping pillar 33 and a third N-type doping pillar 34 are respectively provided on two sides of and below the dielectric trench region 2. A first P-type doping pillar 43 and a second P-type doping pillar 44 are respectively provided on two sides of the conductive pathway. A P-type substrate 1 is below the conductive pathway.

A pair of adjacent N-type doping pillar and P-type doping pillar constitutes one group. The doping-overlapping structure includes a plurality of groups with N-type doping pillars and P-type doping pillars in an alternating mode, wherein the number of groups are more than 2.

Particularly, the order and position of the arrangement of the P-type doping pillars and the N-type doping pillars can be interchanged. For example, the arrangement can be N-P-N-P . . . or P-N-P-N . . . .

Particularly, the N-type doping pillars can have different widths as the P-type doping pillars.

Particularly, the doping type of the device structure can be correspondingly changed to the opposite doping type, that is, the P-type doping becomes N-type doping, while the N-type doping becomes P-type doping.

Embodiment 2

Figure 3:
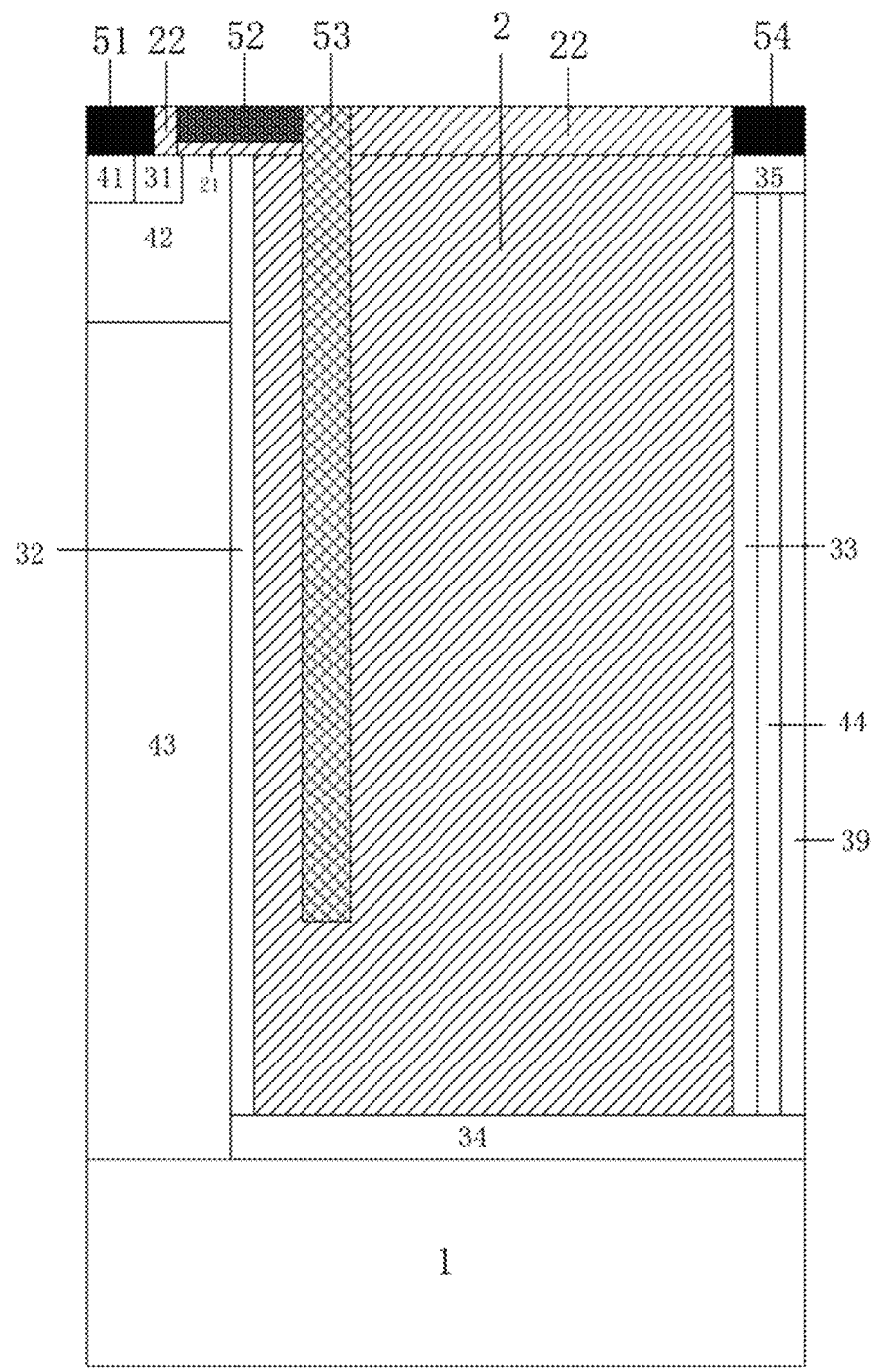
FIG. 3 is a schematic diagram of a device structure of the embodiment 2 of the invention, wherein the doping-overlapping structure is located on the right side of the dielectric trench region.

As shown in FIG. 3, the embodiment 2 and embodiment 1 are essentially the same, except that: the doping-overlapping structure is on the right side of the dielectric trench region 2. When the doping-overlapping structure is on the right side of the dielectric trench region 2, the doping-overlapping structure sequentially includes the second N-type doping pillar 33, the second P-type doping pillar 44 and the seventh N-Type doping pillar 39. The upper surfaces of N-type doping pillar 33, P-type doping pillar 44 and N-type doping pillar 39 contact with the second N-type heavy doping region 35.

Embodiment 3

Figure 4:
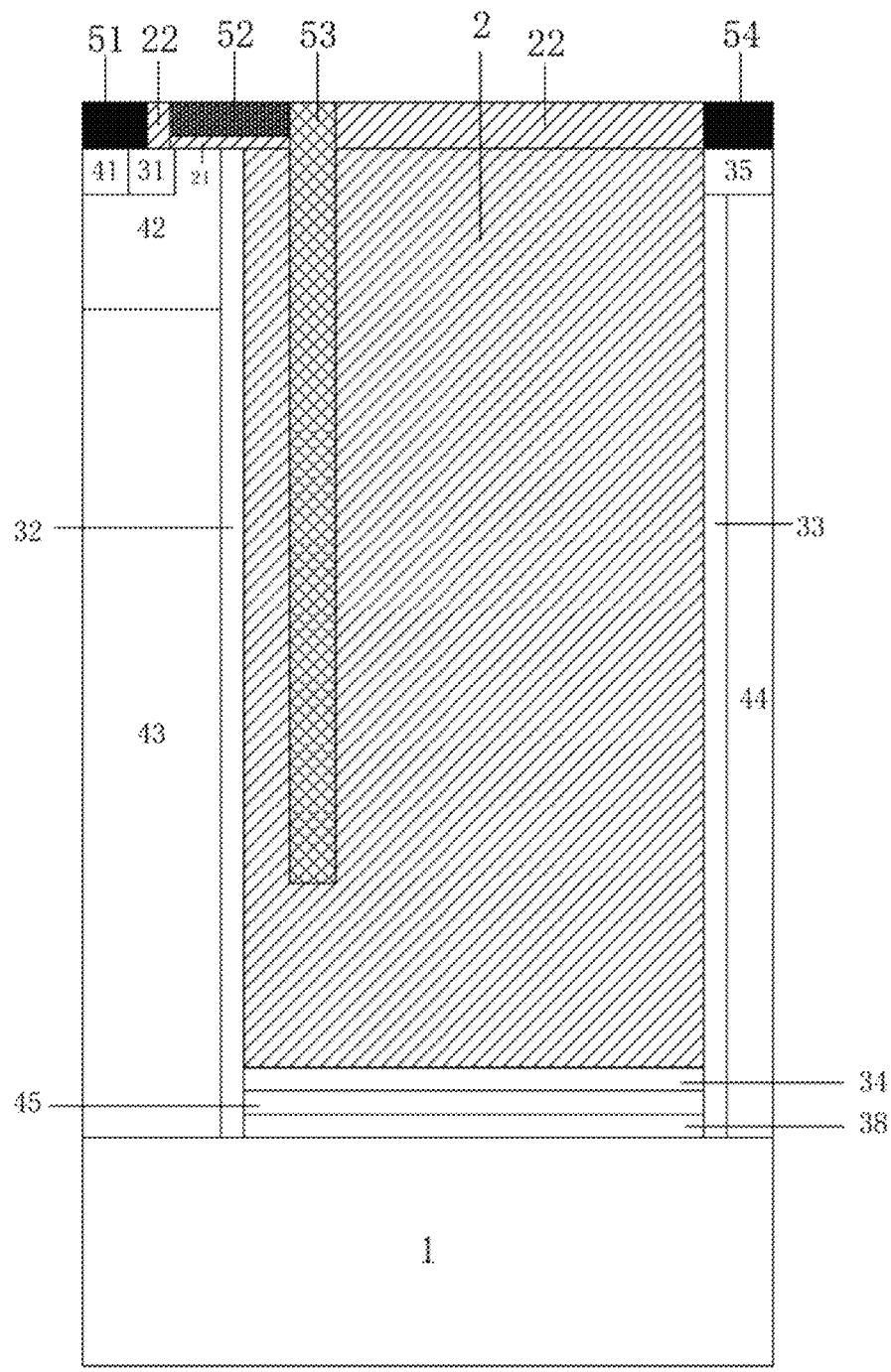
FIG. 4 is a schematic diagram of a device structure of the embodiment 3 of the invention, wherein the doping-overlapping structure is located blow the dielectric trench region.

As shown in FIG. 4, the embodiment 3 and embodiment 1 are essentially the same, except that: the doping-overlapping structure is below the dielectric trench region 2. When the doping-overlapping structure is below the dielectric trench region 2, the doping-overlapping structure sequentially includes the third N-type doping pillar 34, the third P-type doping pillar 45 and the sixth N-type doping pillar 38.

Embodiment 4

Figure 5:
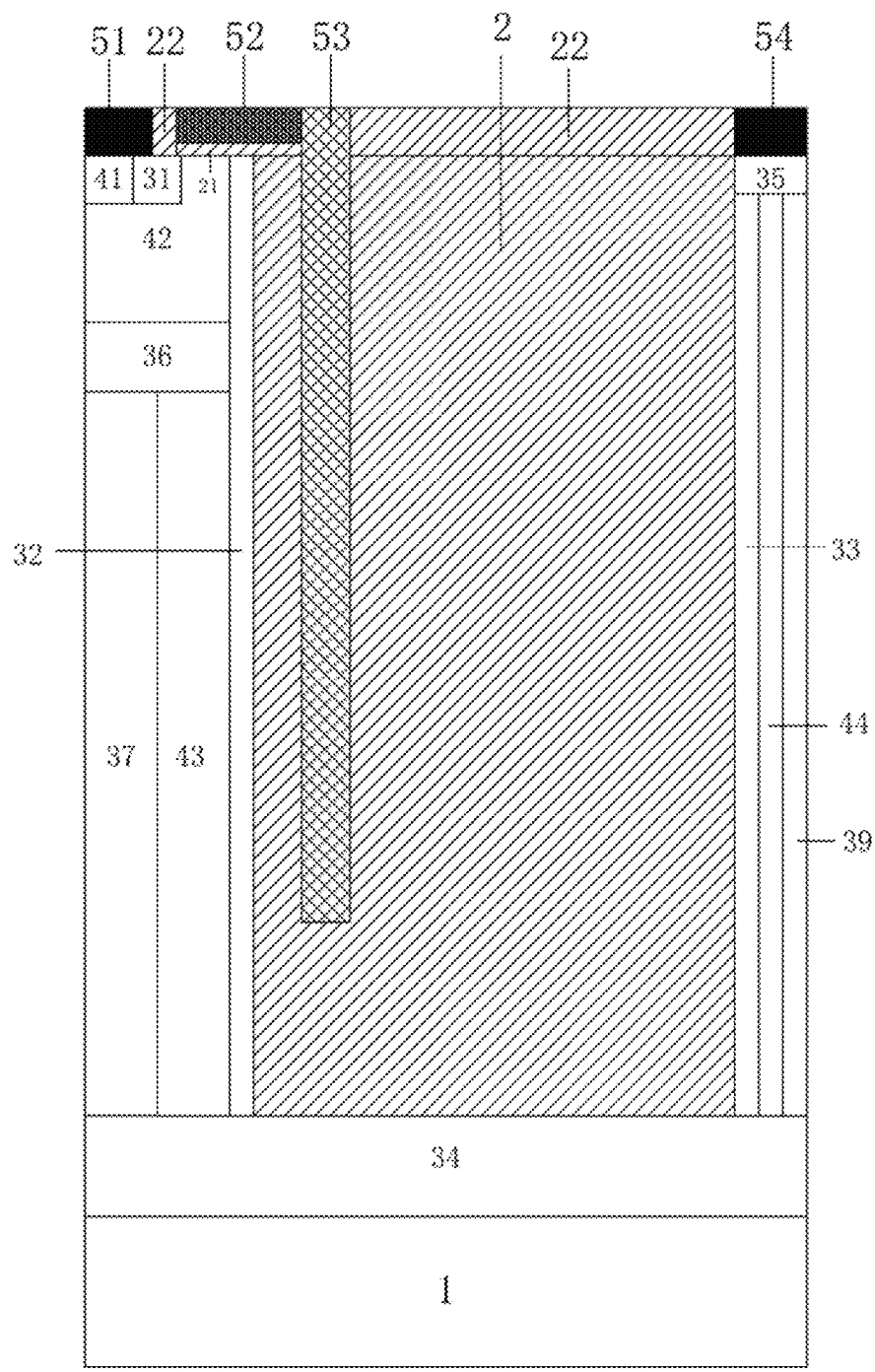
FIG. 5 is a schematic diagram of a device structure of the embodiment 4 of the invention, wherein the doping-overlapping structures are located on the right side and left side of the dielectric trench region.

As shown in FIG. 5, the embodiment 4 and embodiment 1 are essentially the same, except that: the doping-overlapping structures are on the right side and left side of the dielectric trench region 2.

The doping-overlapping structure on the right side of the dielectric trench region 2 sequentially includes the second N-type doping pillar 33, the second P-type doping pillar 44 and the seventh N-Type doping pillar 39. The upper surfaces of N-type doping pillar 33, P-type doping pillar 44 and N-type doping pillar 39 contact with the second N-type heavy doping region 35. The doping-overlapping structure on the left side of the dielectric trench region 2 sequentially includes the first N-type doping pillar 32, the first P-type doping pillar 43 and the fifth N-type doping pillar 37, and there is a fourth N-type doping pillar 36 between the doping-overlapping structure and the P-well region 42.

Embodiment 5

Figure 6:
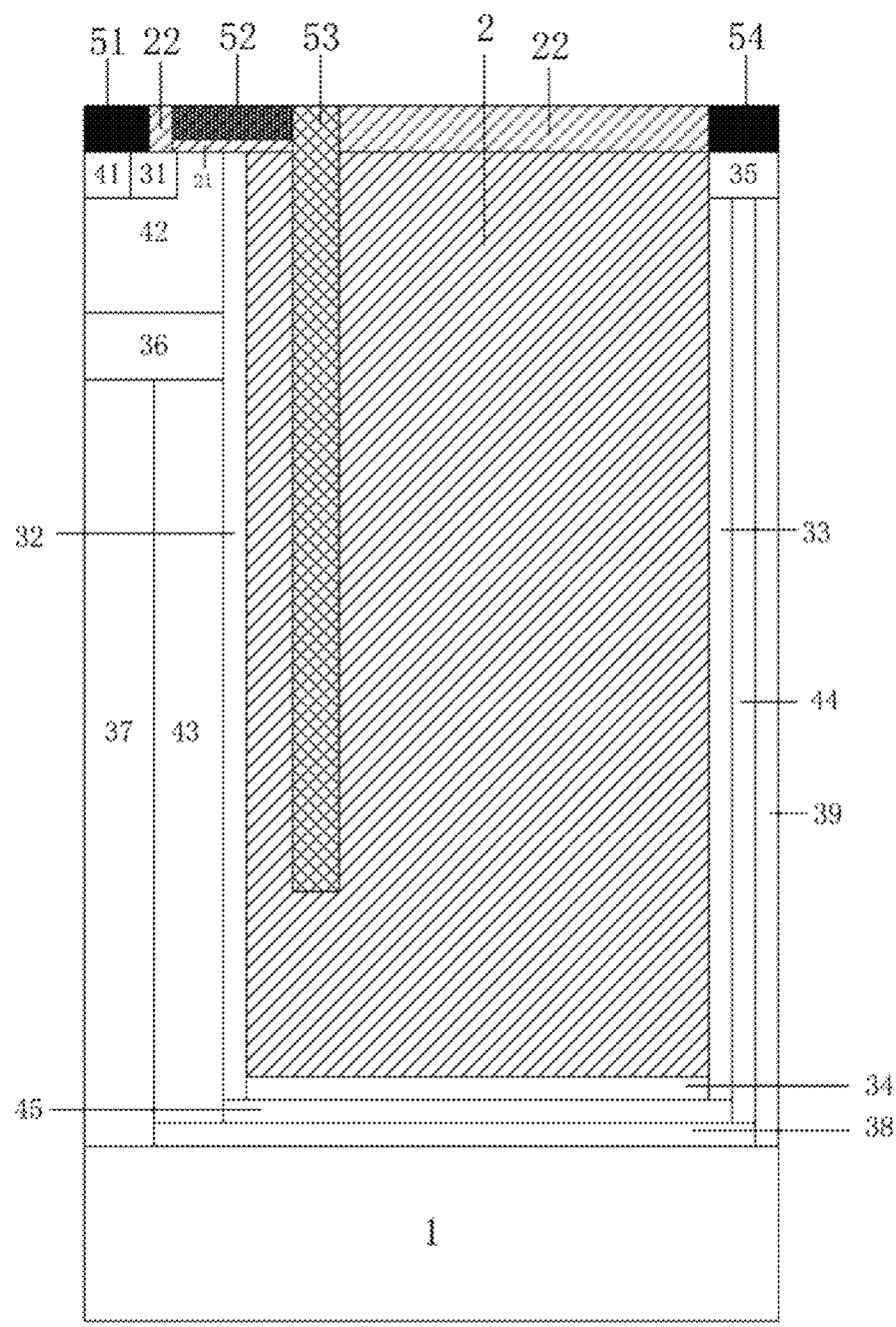
FIG. 6 is a schematic diagram of a device structure of the embodiment 5 of the invention, wherein the doping-overlapping structures are located on the right side of, on the left side of, and below the dielectric trench region.

As shown in FIG. 6, the embodiment 5 and embodiment 1 are essentially the same, except that: the doping-overlapping structures are on the right side of, on the left side of and below the dielectric trench region 2.

The doping-overlapping structure below the dielectric trench region 2 sequentially includes the third N-type doping pillar 34, the third P-type doping pillar 45 and the sixth N-type doping pillar 38.

The doping-overlapping structure on the right side of the dielectric trench region 2 sequentially includes the second N-type doping pillar 33, the second P-type doping pillar 44 and the seventh N-Type doping pillar 39, and the upper surfaces of the N-type doping pillar 33, P-type doping pillar 44 and N-type doping pillar 39 contact with the second N-type heavy doping region 35.

The doping-overlapping structure on the left side of the dielectric trench region 2 sequentially includes the first N-type doping pillar 32, the first P-type doping pillar 43 and the fifth N-type doping pillar 37, and there is a fourth N-type doping pillar 36 between the doping-overlapping structure and the P-well region 42.

Embodiment 6

Figure 7:
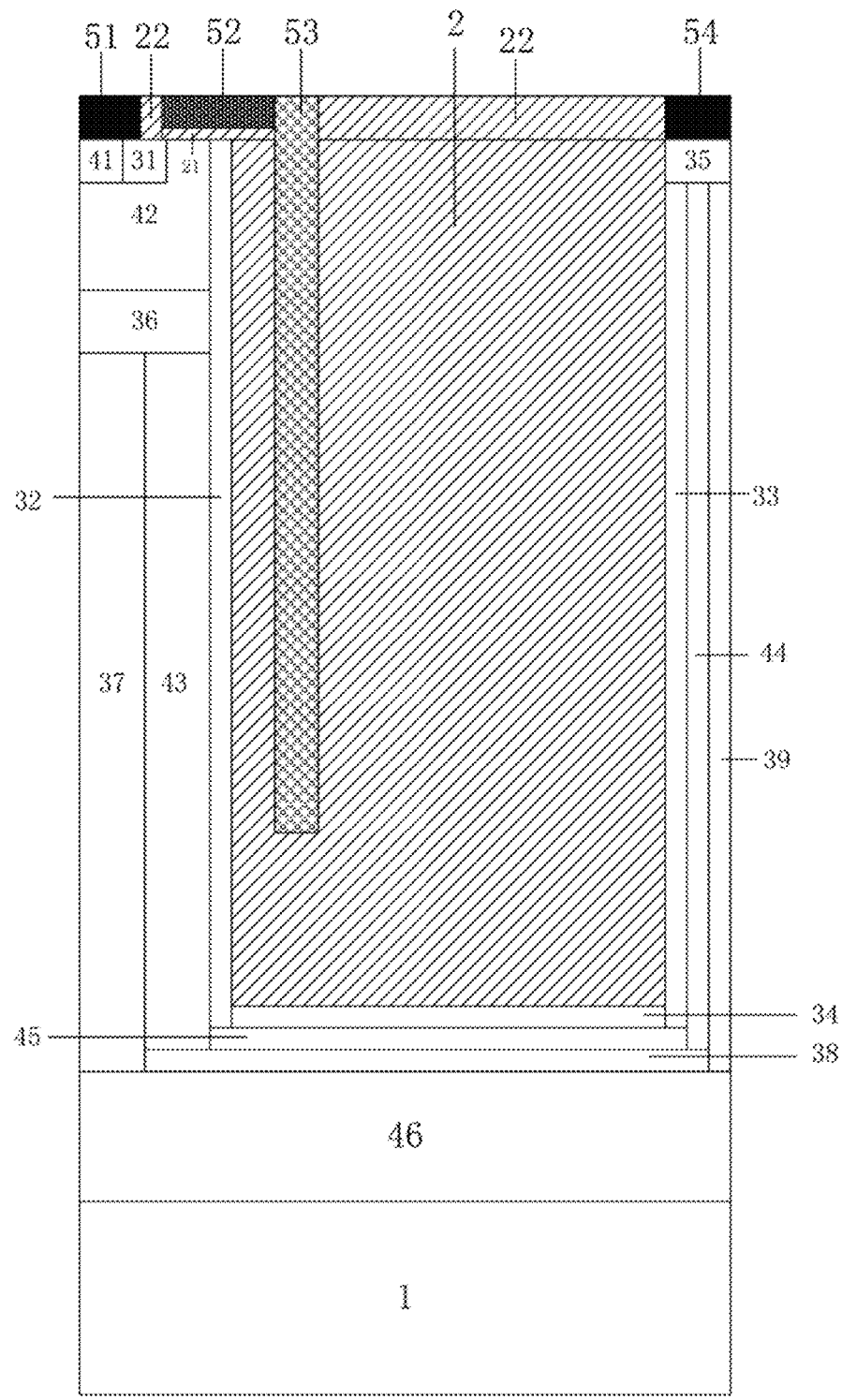
FIG. 7 is a schematic diagram of a device structure of the embodiment 6 of the invention, wherein an epitaxial layer is located between the P-type substrate and the conductive path.

As shown in FIG. 7, the embodiment 6 and embodiment 5 are essentially the same (there are doping-overlapping structures on the right side of, on the left side of and below the dielectric trench region 2), except that: there is an epitaxial layer 46 between the P-type substrate 1 and the conductive pathway.

Embodiment 7

Figure 8:
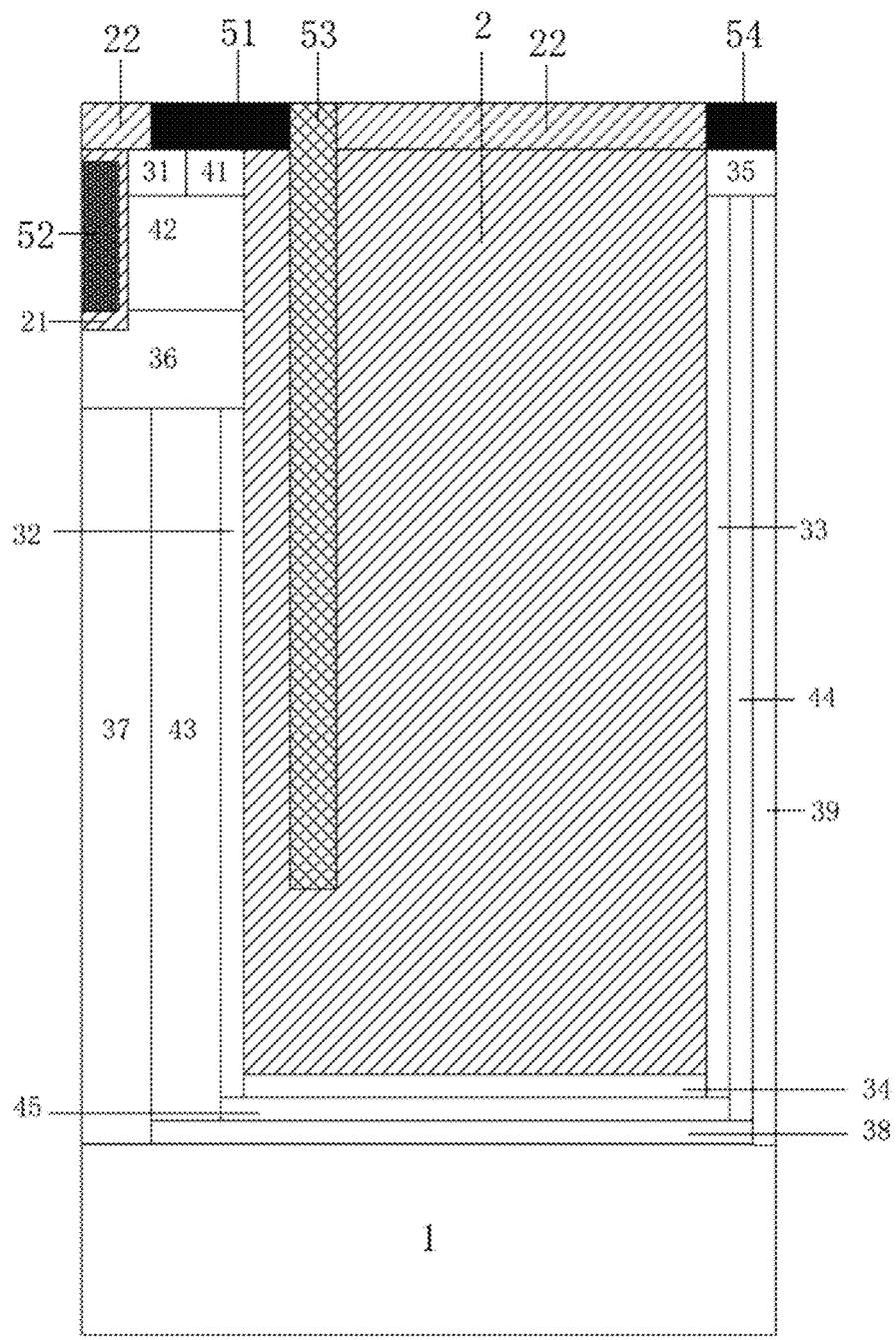
FIG. 8 is a schematic diagram of a device structure with a shallow trench gate in the embodiment 7 of the invention.

As shown in FIG. 8, the embodiment 7 and embodiment 5 are essentially the same (there are doping-overlapping structures on the right side of, on the left side of and below the dielectric trench region 2), except that: the polysilicon gate 52 and the gate oxide layer 21 constitute a trench gate, and the source contacting terminal 51 and the body field plate 53 are adjacent.

Embodiment 8

Figure 9:
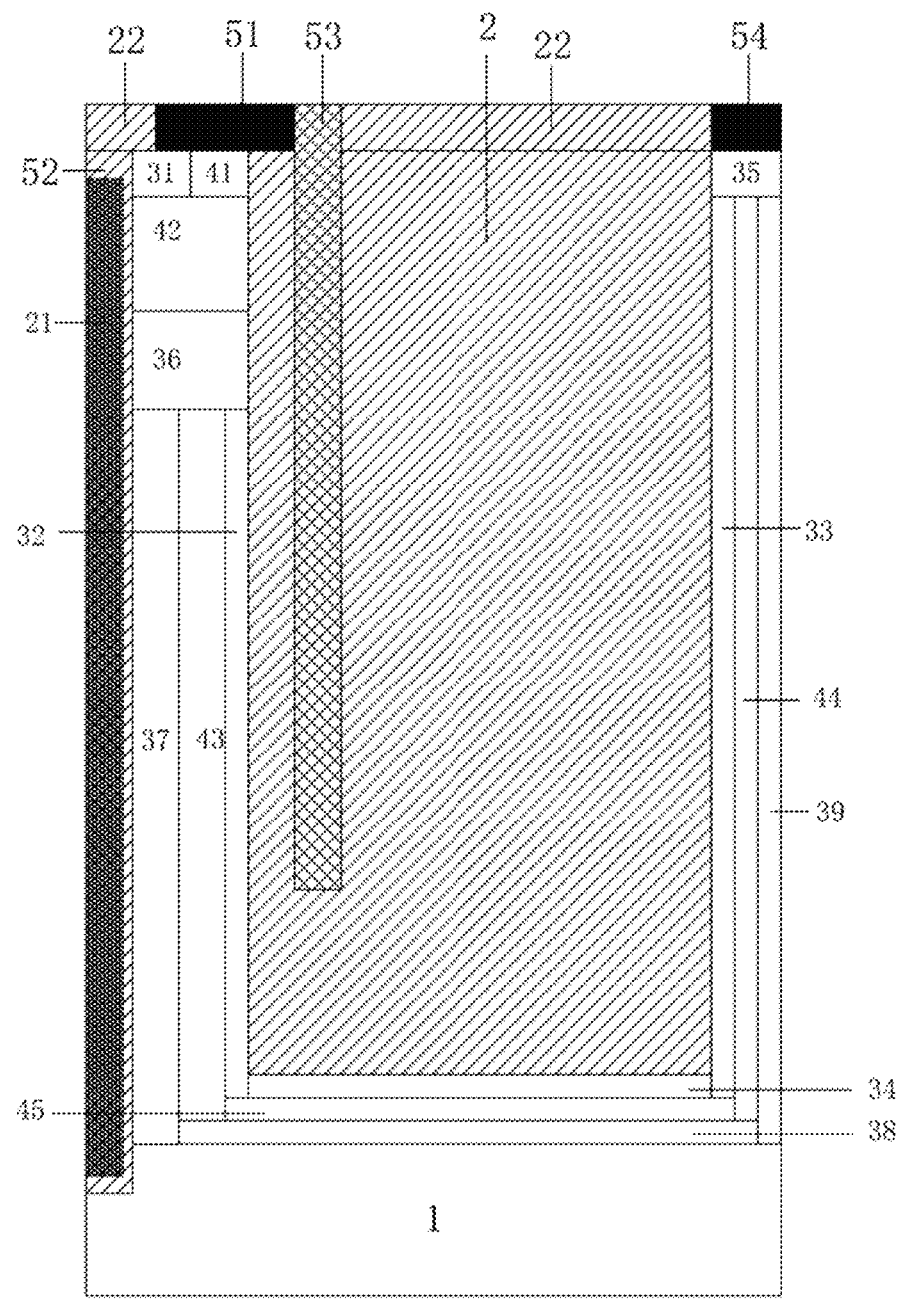
FIG. 9 is a schematic diagram of a device structure with a trench gate in the embodiment 8 of the invention.

As shown in FIG. 9, the embodiment 8 and embodiment 7 are essentially the same, except that: the trench gate consisting of the polysilicon gate 52 and the gate oxide layer 21 extends to the interior of the P-type substrate 1, and the source contacting terminal 51 and the body field plate 53 are adjacent.

Embodiment 9

Figure 10:
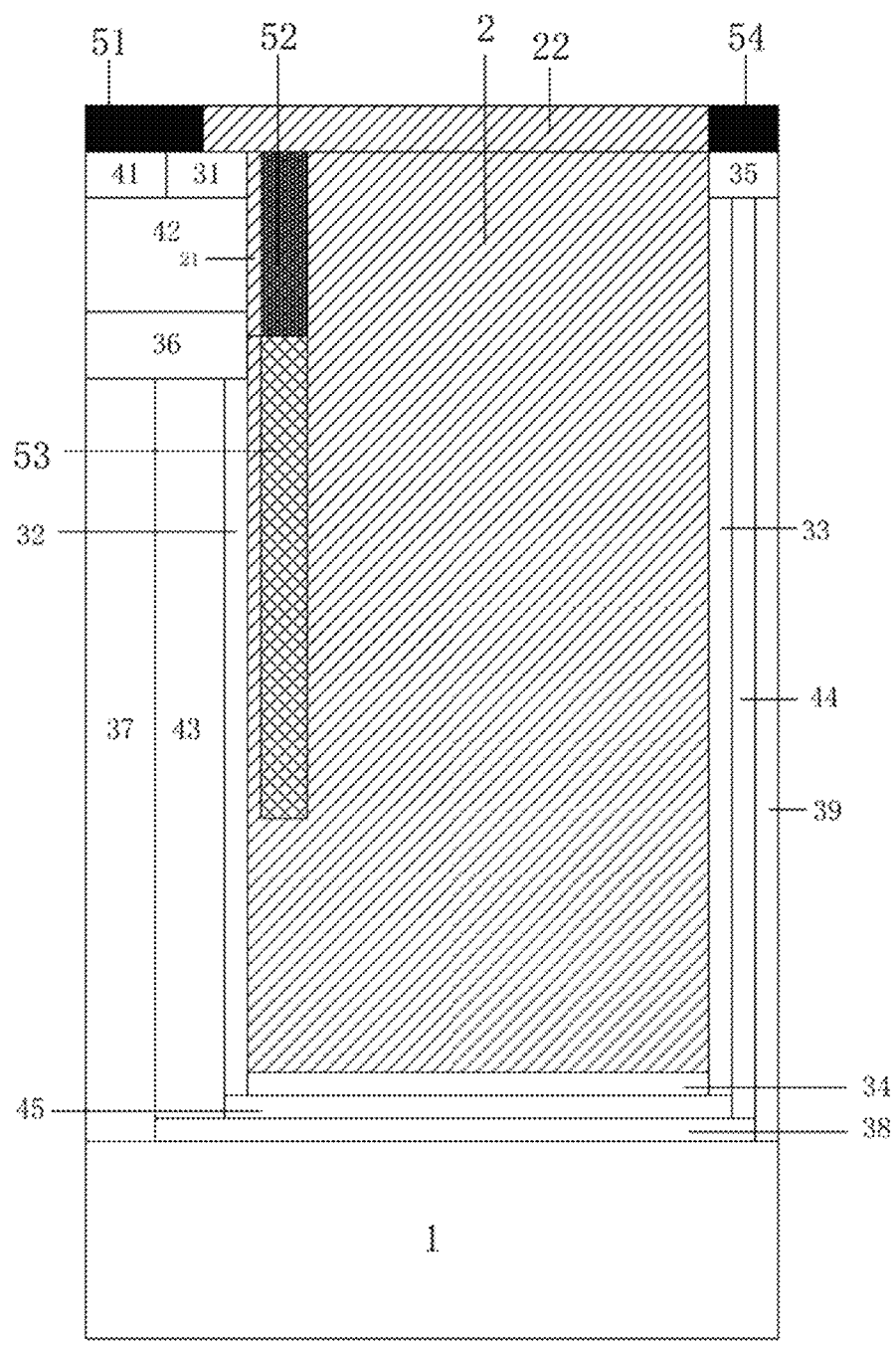
FIG. 10 is a schematic diagram of a device structure of the embodiment 9 of the invention, wherein a trench gate is located in the dielectric trench region.

As shown in FIG. 10, the embodiment 9 and embodiment 7 are essentially the same, except that: the trench gate consisting of the polysilicon gate 52 and the gate oxide layer 21 is arranged inside the dielectric trench region 2.

Embodiment 10

Figure 11:
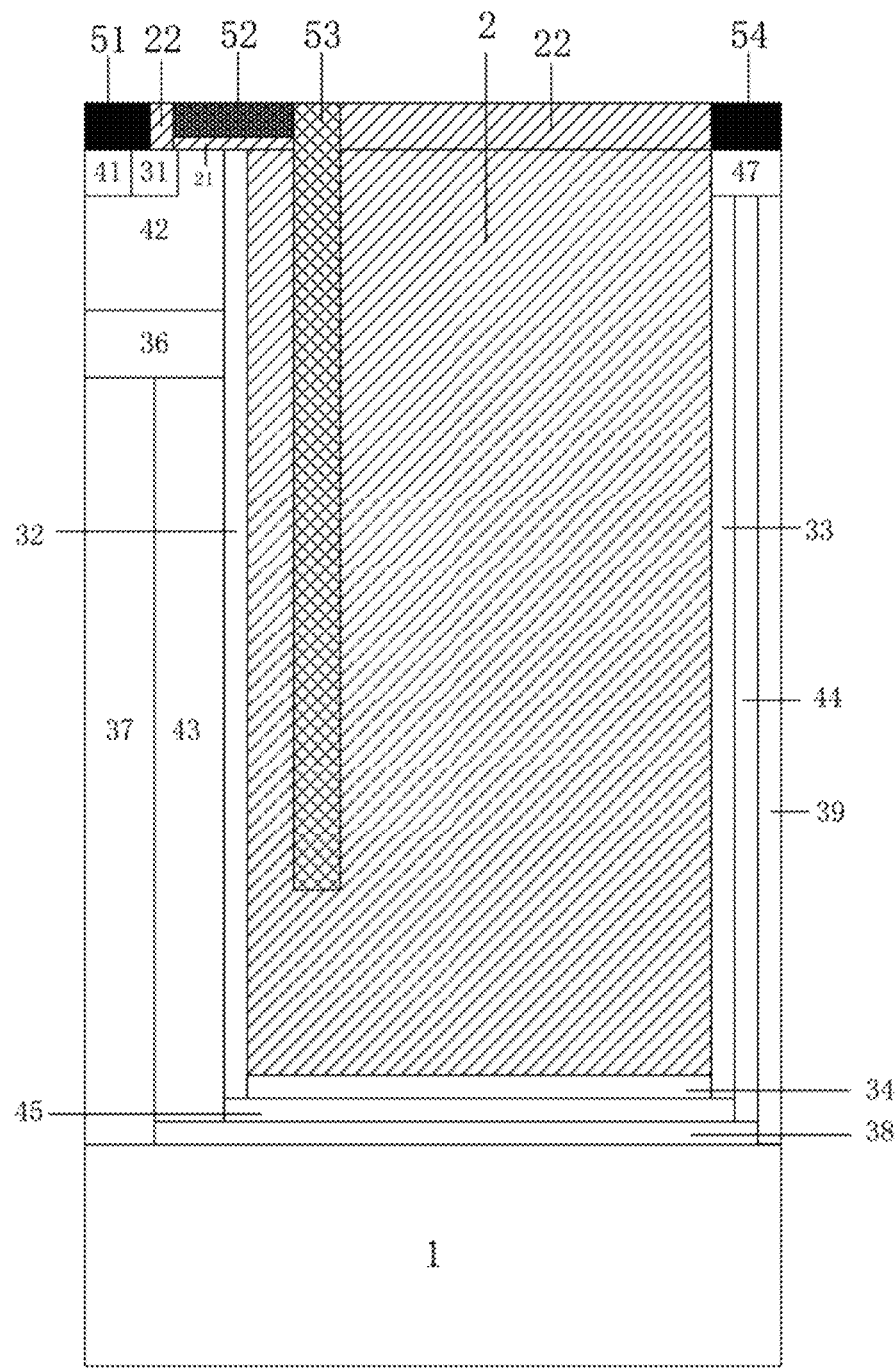
FIG. 11 is a schematic diagram of a LIGBT device of the embodiment 10 of the invention.

As shown in FIG. 11, the embodiment 10 and embodiment 5 are essentially the same, except that: the second N-type heavy doping region 35 is replaced by the collector P-type heavy doping region 47, so the device is changed from a LDMOS device to a LIGBT device.

Embodiment 11

Figure 12:
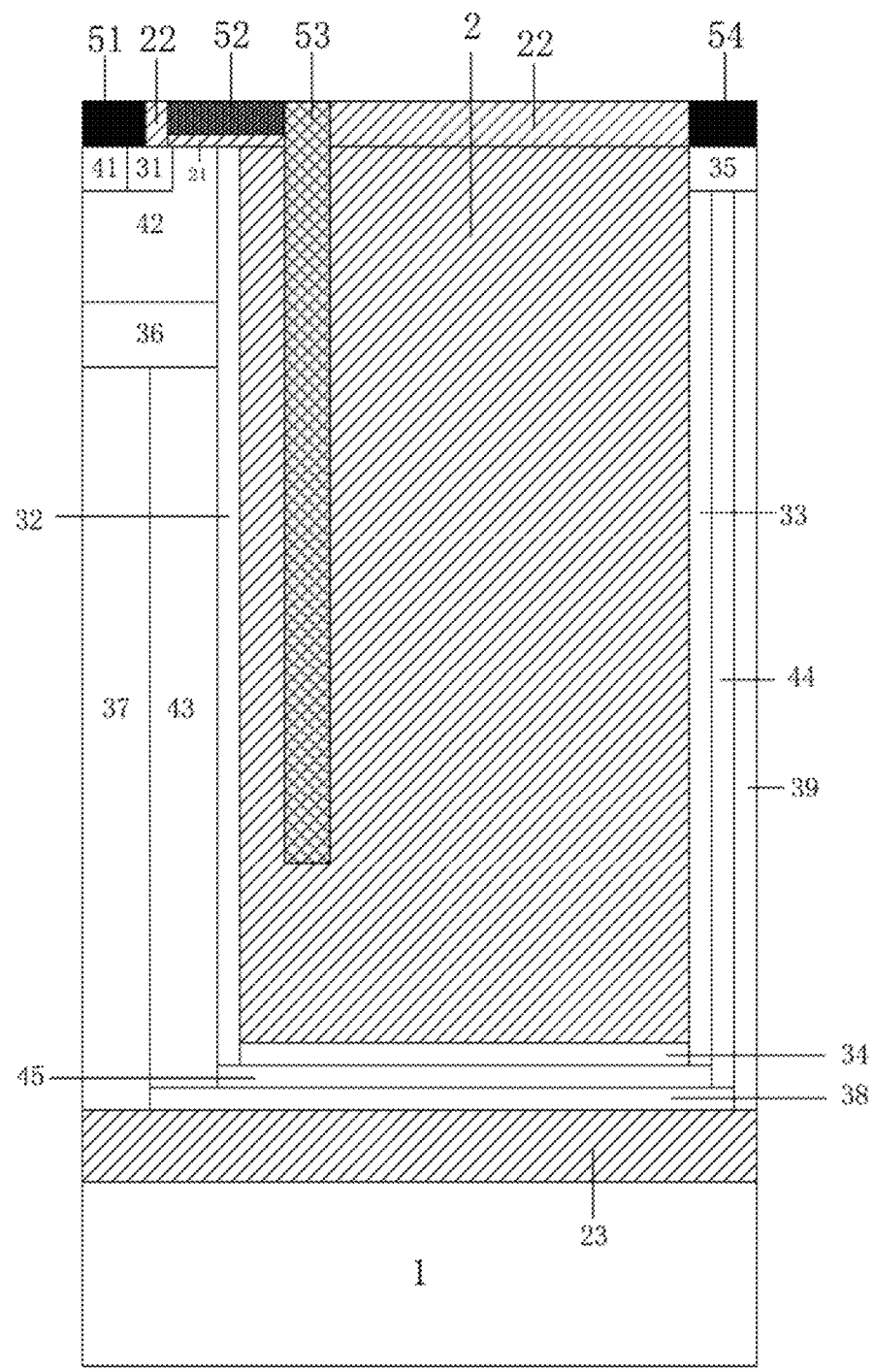
FIG. 12 is a schematic diagram of a SOI device without epitaxial layer of the embodiment 11 of the invention.

As shown in FIG. 12, the embodiment 11 and embodiment 5 are essentially the same, except that: the device is a SOI device. The SOI buried oxygen layer 23 is below the doping-overlapping structure, which is below the dielectric trench region 2. The substrate 1 is N-type silicon or P-type silicon for SOI devices.

Embodiment 12

Figure 13:
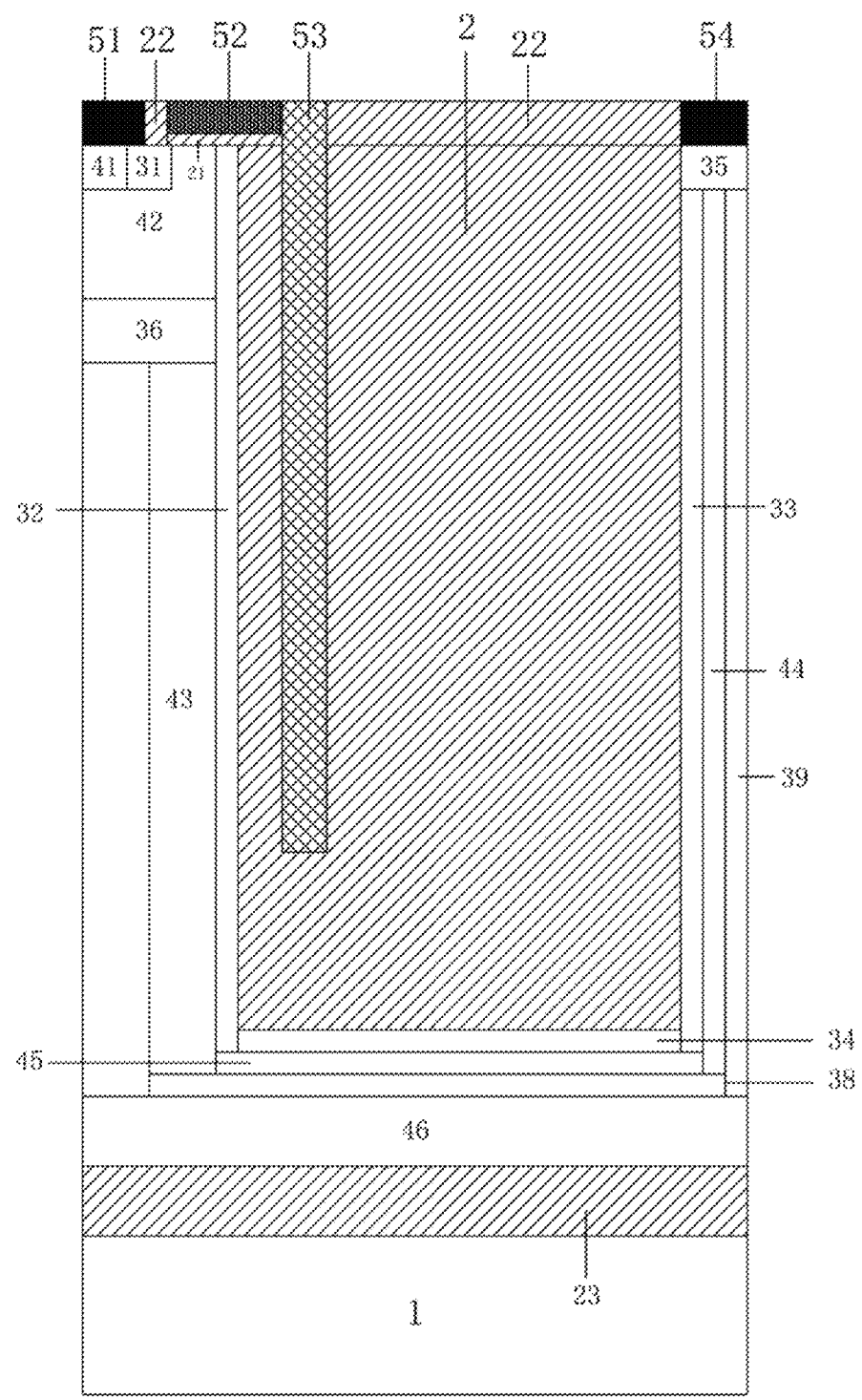
FIG. 13 is a schematic diagram of a SOI device with an epitaxial layer of the embodiment 12 of the invention.

As shown in FIG. 13, the embodiment 12 and embodiment 11 are essentially the same, except that: the device is a SOI device. The epitaxial layer 46 is below the doping-overlapping structure, which is below the dielectric trench region 2. The epitaxial layer 46 is arranged between the SOI buried oxygen layer 23 and the conductive pathway.

Embodiment 13

Figure 14:
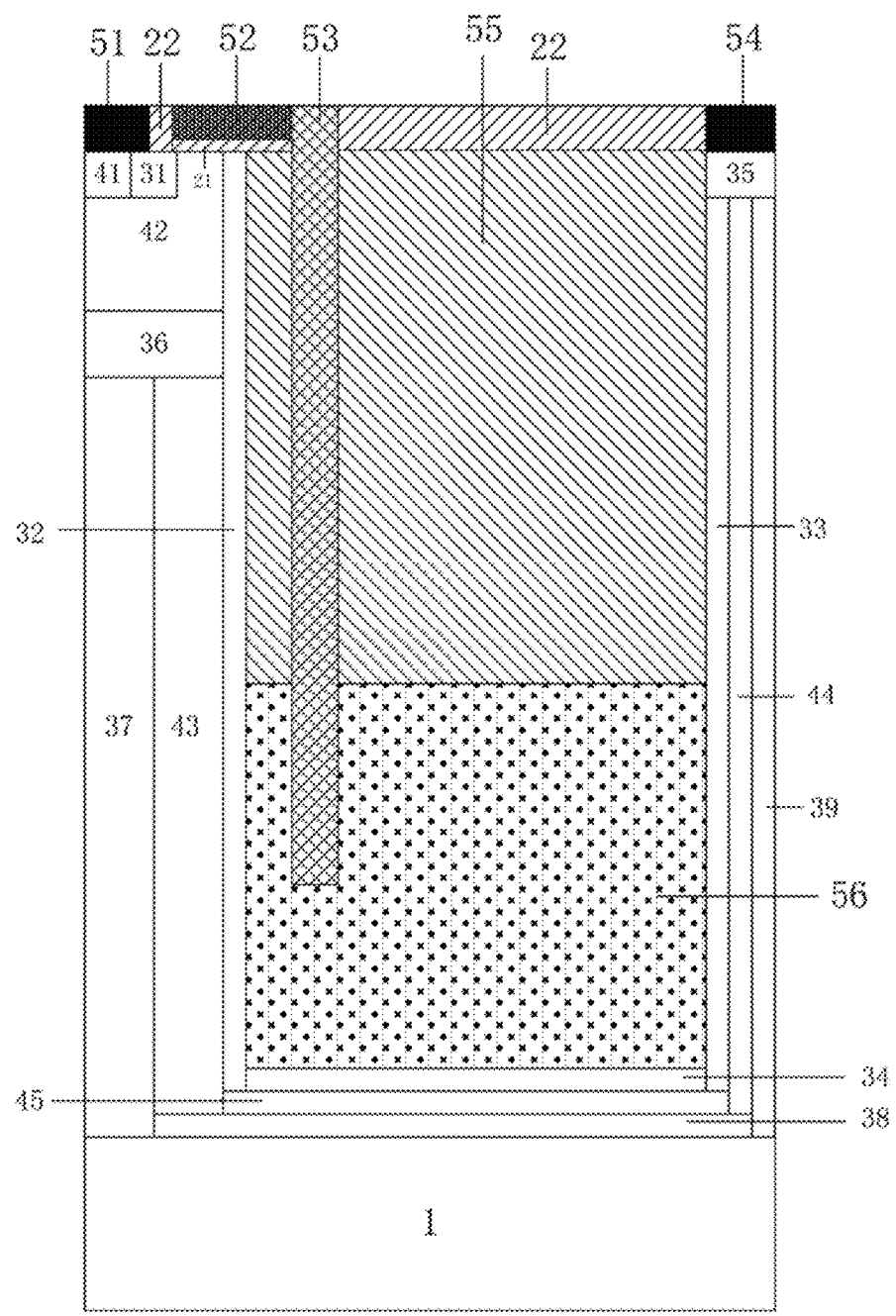
FIG. 14 is a schematic diagram of a device of the embodiment 13 of the invention, wherein the dielectric trench region is composed of two dielectric media having different dielectric constants.

As shown in FIG. 14, the embodiment 13 and embodiment 5 are essentially the same (there are doping-overlapping structures on the right side of, on the left side of and below the dielectric trench region 2), except that: the dielectric trench region 2 comprises a low-K dielectric trench 55 in the upper portion and the dielectric trench 56 in the lower portion. The low-k dielectric refers to the dielectric having a dielectric constant lower than the that of $SiO_2$. By setting the low-K dielectric trench in the dielectric trench region, a new electric field peak is introduced due to the intersection of dielectric media having different dielectric constants, and the breakdown voltage BV of the device is further improved, and finally the aim of obtaining a high breakdown voltage BV voltage while keeping a low specific On-Resistance $R_{ON,sp}$ of the device is achieved.

Embodiment 14

Figure 15:
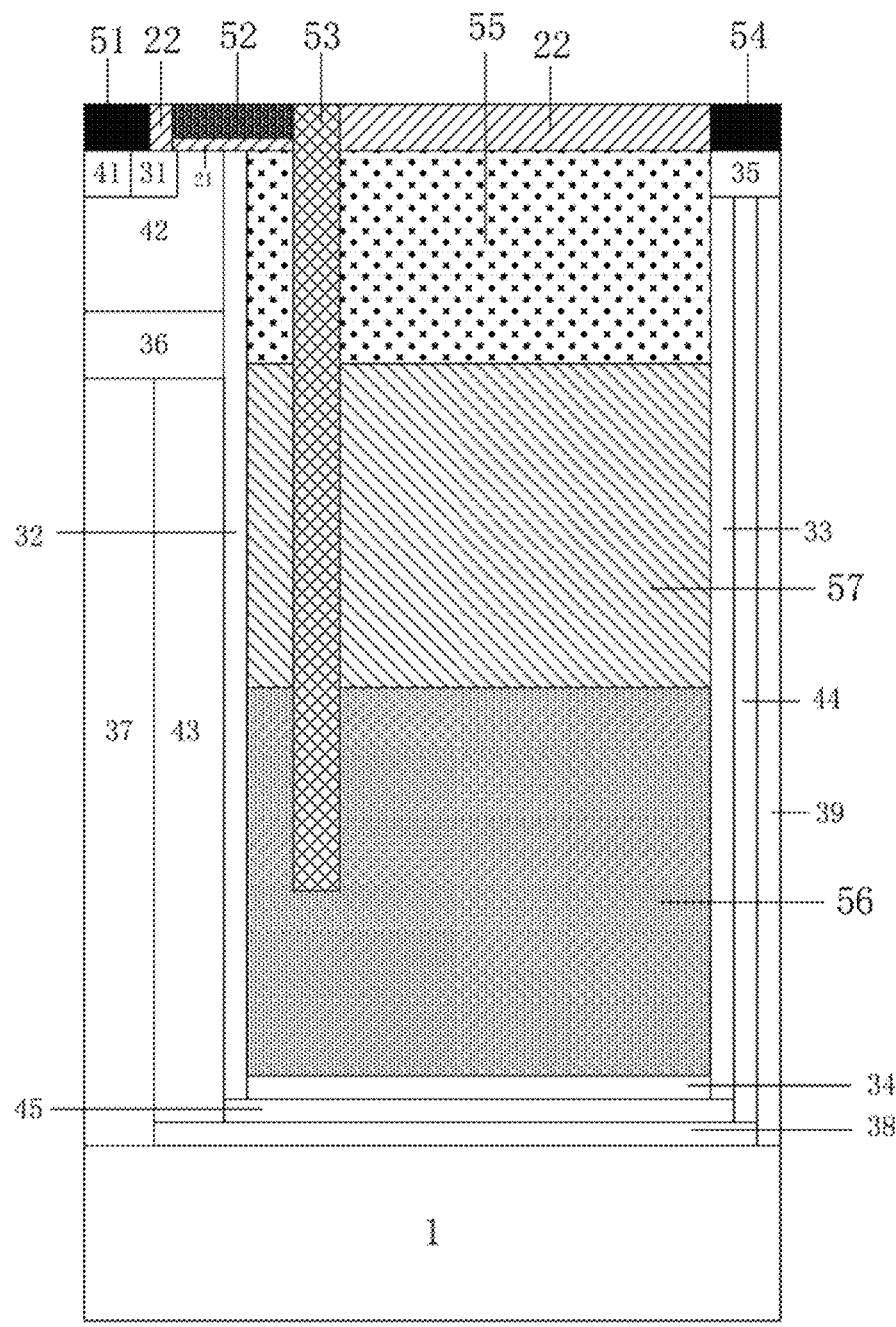
FIG. 15 is a schematic diagram of a device of the embodiment 14 of the invention, wherein the dielectric trench region is composed of three dielectric media having different dielectric constants.

As shown in FIG. 15, the embodiment 14 and embodiment 13 are essentially the same (there are doping-overlapping structures on the right side of, on the left side of and below the dielectric trench region 2), except that: the dielectric trench region 2 is divided into a plurality of dielectric regions with different dielectric constants, and the dielectric constant in each dielectric area is raised in turn from top to bottom. This will introduce a plurality of electric field peaks, further enhancing the breakdown voltage BV of the device.

Dielectric trench 57 is below the dielectric trench 55, and the dielectric constant of the dielectric trench 57 is higher than that of the low-K dielectric trench 55. The dielectric constant of the dielectric trench 56 is higher than that of the second dielectric trench 57. A new electric field peak is introduced due to the intersection of dielectric media having different dielectric constants, greatly improving the breakdown voltage BV of the device.

Embodiment 15

Figure 16:
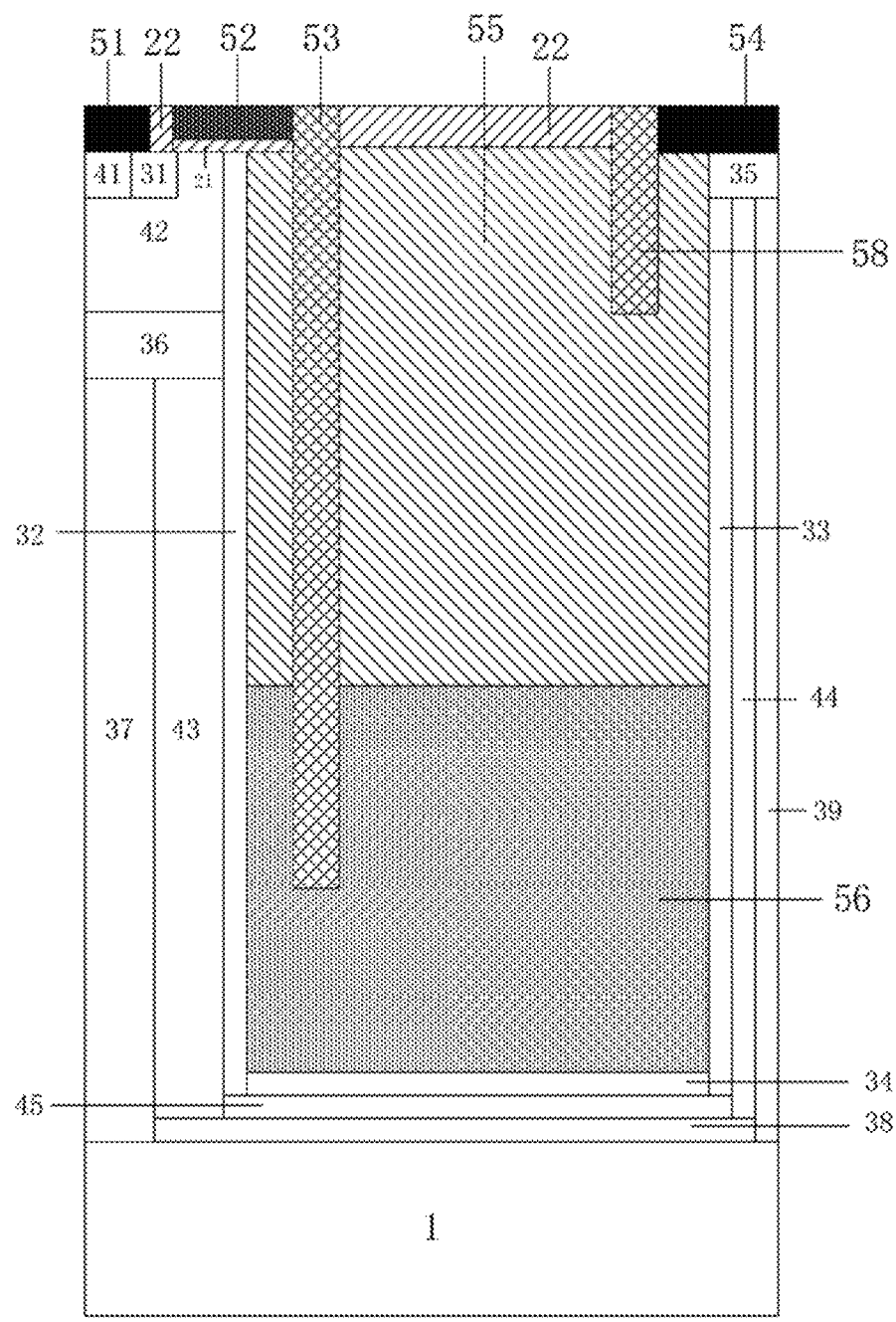
FIG. 16 is a schematic diagram of a device of the embodiment 15 of the invention, wherein the drain terminal introduces the drain terminal field.
Figure 17:
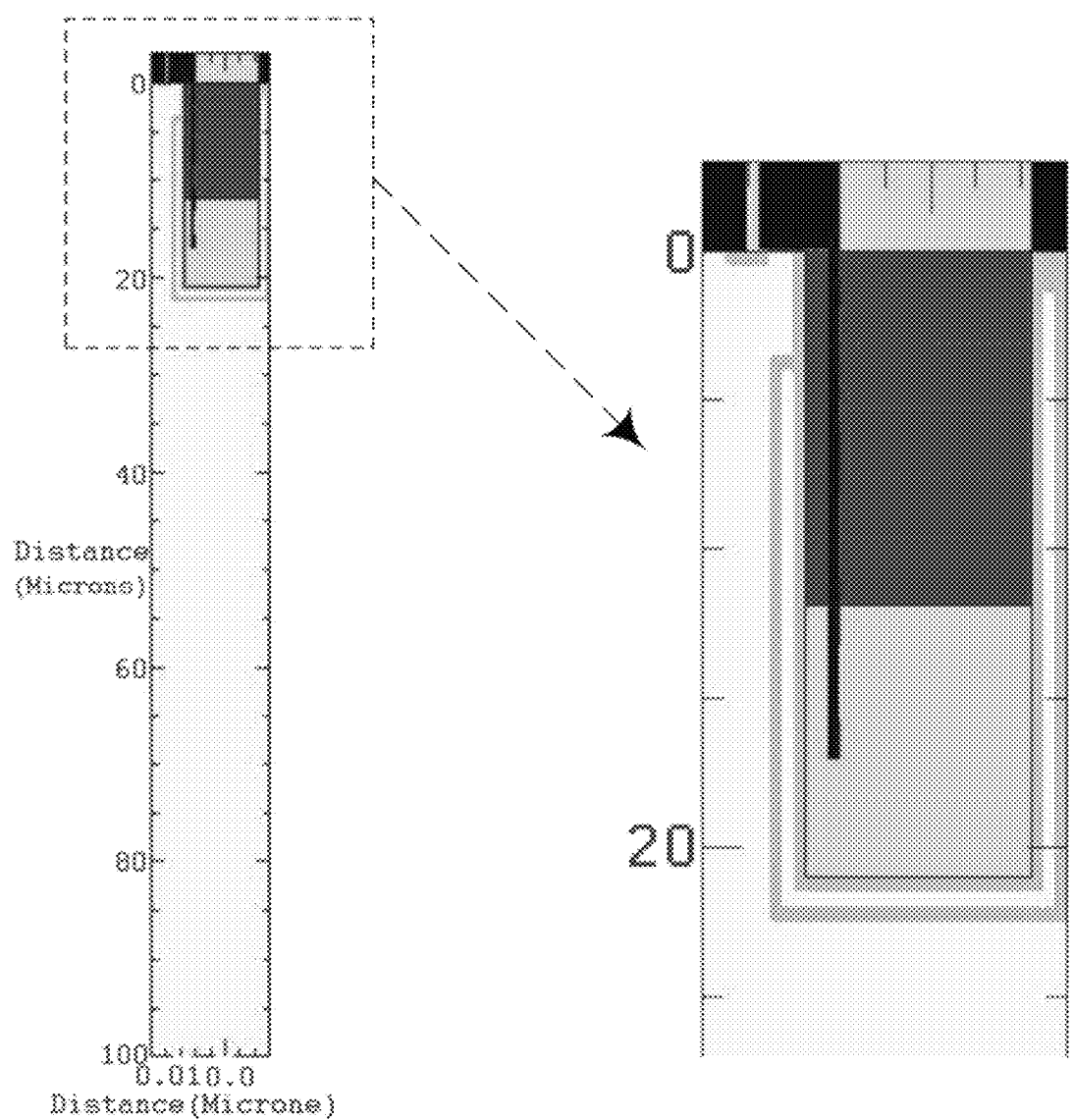
FIG. 17 is a schematic diagram of a device simulation structure of the embodiment 13 of the invention.

As shown in FIG. 16, the embodiment 15 and embodiment 13 are essentially the same, except that: the left side of drain contacting terminal 54 contacts with the electrode field plate 58, and the electrode field plate 58 extends from the surface of the device to the interior of the dielectric trench region.

The above-mentioned embodiments are only illustrative of the principle and effect of the invention, and are not intended to limit the invention. Any person familiar with the technology may modify or alter the embodiments without violating the spirit and scope of the invention. Therefore, any equivalent modifications or alterations made by the person skilled in the art without departing from the spirit and technical concepts disclosed by the invention, shall fall into the scope of the claims of the invention.

What is claimed is:

1. A lateral high-voltage device, comprising:
a dielectric trench region, a doping-overlapping structure with different doping types alternating mode is provided at least below, on a left side of, or on a right side of the dielectric trench region, an upper surface of the dielectric trench region is a dielectric layer, and a body field plate extends from an upper surface of the device to an interior of the dielectric trench region, the body field plate adjacently connects a polysilicon gate, a gate oxide layer is provided below the polysilicon gate,
a source contacting terminal and the polysilicon gate are isolated through the dielectric layer, the body field plate and a drain contacting terminal are isolated through the dielectric layer, a second N-type heavy doping region is below the drain contacting terminal, an adjacent P-type heavy doping region and a first N-type heavy doping region are below the source contacting terminal, the P-type heavy doping region and the first N-type heavy doping region are positioned in a P well region and at the top of the P well region, the gate oxide layer is positioned above the P-well region,
a first N-type doping pillar, a second N-type doping pillar and a third N-type doping pillar are respectively provided on two sides and below the dielectric trench region, the first N-type doping pillar, the second N-type doping pillar and the third N-type doping pillar form a conductive pathway, a first P-type doping pillar and a second P-type doping pillar are provided on two sides of the conductive pathway, a P-type substrate is below the conductive pathway;
if the doping-overlapping structure is below the dielectric trench region, then the doping-overlapping structure sequentially includes the third N-type doping pillar, a third P-type doping pillar and a sixth N-type doping pillar; if the doping-overlapping structure is on the right side of the dielectric trench region, then the doping-overlapping structure sequentially includes the second N-type doping pillar, the second P-type doping pillar and a seventh N-Type doping pillar, and upper surfaces of the N-type doping pillar, the P-type doping pillar and the N-type doping pillar contact with the second N-type heavy doping region; if the doping-overlapping structure is on the left side of the dielectric trench region, then the doping-overlapping structure sequentially includes the first N-type doping pillar, the first P-type doping pillar and a fifth N-type doping pillar, and there is a fourth N-type doping pillar between the doping-overlapping structure and the P-well region.

2. The lateral high-voltage device according to claim 1, wherein the dielectric trench region is divided into a plurality of dielectric regions with different dielectric constants from top to bottom, and a dielectric constant in each dielectric area is raised in turn from top to bottom.

3. The lateral high-voltage device according to claim 1, wherein a pair of adjacent N-type doping pillar and P-type doping pillar constitutes one group, the doping-overlapping structures includes more than two groups with multiple N-type doped pillars and P-type doped pillars in an alternating mode.

4. The lateral high-voltage device according to claim 1, wherein the device is a SOI device, and the substrate is N-type silicon or P-type silicon for the SOI device.

5. The lateral high-voltage device according to claim 1, wherein there is an epitaxial layer between the P-type substrate and the conductive pathway, or the epitaxial layer is arranged between a SOI buried oxygen layer and the conductive pathway.

6. The lateral high-voltage device according to claim 1, wherein the polysilicon gate and the gate oxide layer constitute a trench gate, the source contacting terminal and the body field plate are adjacent.

7. The lateral high-voltage device according to claim 6, wherein a trench gate consisting of the polysilicon gate and the gate oxide layer extends to an interior of the P-type substrate, and the source contacting terminal and the body field plate are adjacent.

8. The lateral high-voltage device according to claim 6, wherein the trench gate consisting of the polysilicon gate and the gate oxide layer is arranged inside the dielectric trench region.

9. The lateral high-voltage device according to claim 1, wherein the second N-type heavy doping region is replaced by a collector P-type heavy doping region, and the device is changed from a LDMOS device to a LIGBT device.

10. The lateral high-voltage device according to claim 1, wherein a left side of the drain contacting terminal contacts with an electrode field plate, and the electrode field plate extends from a surface of the device to the interior of the dielectric trench region.

11. The lateral high-voltage device according to claim 1, wherein the N-type doping pillars have different widths as the P-type doping pillars.

12. The lateral high-voltage device according to claim 1, wherein the doping type of the device structure is correspondingly changed to an opposite doping type, that is, the P-type doping becomes the N-type doping, while the N-type doping becomes the P-type doping.

* * * * *